(12) United States Patent
Cataldo et al.

(10) Patent No.: US 9,338,933 B2
(45) Date of Patent: May 10, 2016

(54) FLEXIBLE, TOTAL COVERAGE ELECTROMAGNETIC WAVE SHIELDING SYSTEM

(71) Applicant: INDUSTRIE ILPEA S.P.A., Malgesso (IT)

(72) Inventors: Claudio Damiano Cataldo, Cugliate Fabiasco (IT); Marco De Giorgi, Varese (IT); Paolo Cittadini, Luvinate (IT)

(73) Assignee: INDUSTRIE ILPEA, S.P.A., Malgesso (IT)

( * ) Notice: Subject to any disclaimer, the term of this patent is extended or adjusted under 35 U.S.C. 154(b) by 0 days.

(21) Appl. No.: 14/399,607

(22) PCT Filed: May 9, 2013

(86) PCT No.: PCT/EP2013/059685
§ 371 (c)(1),
(2) Date: Nov. 7, 2014

(87) PCT Pub. No.: WO2013/167712
PCT Pub. Date: Nov. 14, 2013

(65) Prior Publication Data
US 2015/0129296 A1    May 14, 2015

(30) Foreign Application Priority Data
May 9, 2012    (IT) .............................. MI2012A0788

(51) Int. Cl.
| H05K 9/00 | (2006.01) |
| H01B 13/14 | (2006.01) |
| H02G 3/04 | (2006.01) |
| H01B 1/02 | (2006.01) |

(52) U.S. Cl.
CPC .............. *H05K 9/0098* (2013.01); *H01B 1/023* (2013.01); *H01B 1/026* (2013.01); *H01B 13/14* (2013.01); *H02G 3/0468* (2013.01); *H05K 9/0088* (2013.01)

(58) Field of Classification Search
CPC . H05K 9/0098; H05K 9/0088; H02G 3/0468; H01B 1/026; H01B 1/023; H01B 13/14
USPC ............... 174/32, 34, 350, 388, 102 R, 102 D
See application file for complete search history.

(56) References Cited

U.S. PATENT DOCUMENTS

| 5,660,899 A * | 8/1997 | Rockney et al. ............. 428/34.7 |
| 6,906,264 B1 * | 6/2005 | Grant, Jr. ............. H02G 3/0468 |
| | | 174/102 D |

(Continued)

FOREIGN PATENT DOCUMENTS

| EP | 1260746 A2 * | 11/2002 |
| WO | 2004076904 A1 | 9/2004 |

OTHER PUBLICATIONS

PCT International Search Report and Written Opinion for PCT/EP2013/059685, mailed Nov. 7, 2013.

*Primary Examiner* — Hoa C Nguyen
*Assistant Examiner* — Amol Patel
(74) *Attorney, Agent, or Firm* — LeClairRyan, a Professional Corporation

(57) ABSTRACT

The present invention relates to a shielding system for conductor cables as well as to a method for producing said shielding system. The system is characterized in that it comprises a corrugated tube (20) coated with one or more thin films of high electrical conductivity material (30) which are reversibly adhered to the surface of said corrugated tube (20) so that said coating can be uncoupled from the corrugated tube due to high bending values of the tube itself. The shielding system according to the present invention therefore combines the excellent shielding efficacy values of a system having thin metal films with the excellent flexibility properties of a corrugated plastic tube.

11 Claims, 3 Drawing Sheets

(56) References Cited

U.S. PATENT DOCUMENTS

| | | | | |
|---|---|---|---|---|
| 8,088,997 B2 * | 1/2012 | Picard | ............... | H01B 9/028 174/102 R |
| 9,040,825 B2 * | 5/2015 | Temblador | ............. | G06Q 50/04 174/102 C |
| 2001/0030054 A1 * | 10/2001 | Goett | ................ | H02G 3/0468 174/106 R |

* cited by examiner

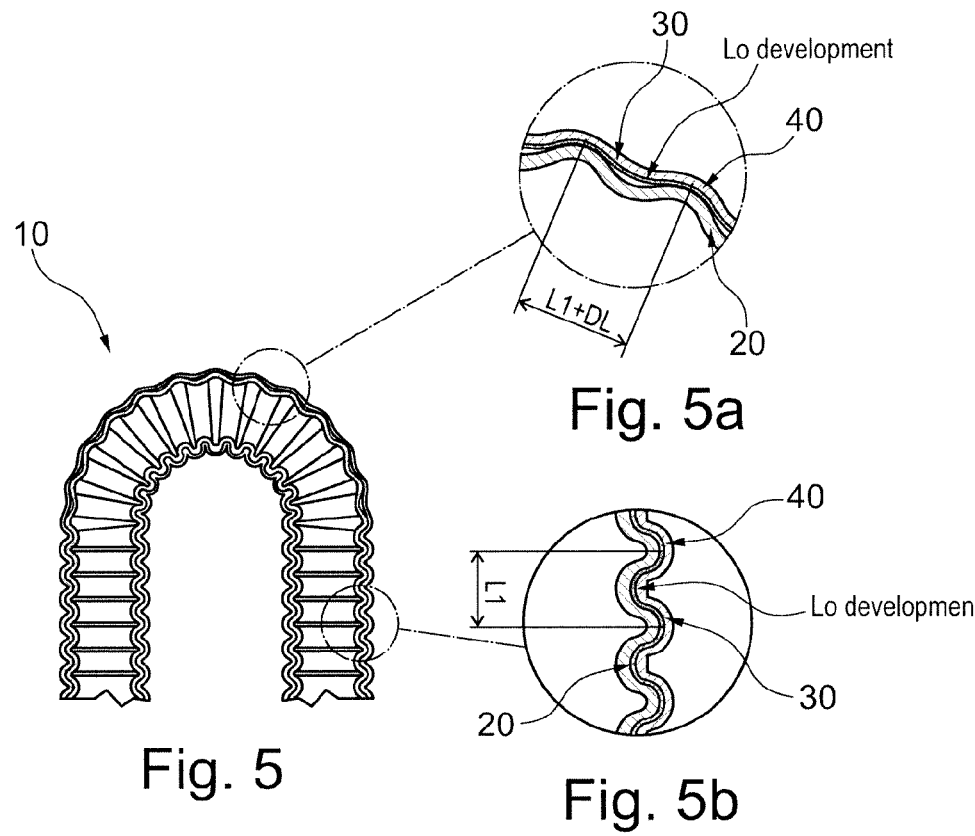
Fig. 5a
Fig. 5
Fig. 5b
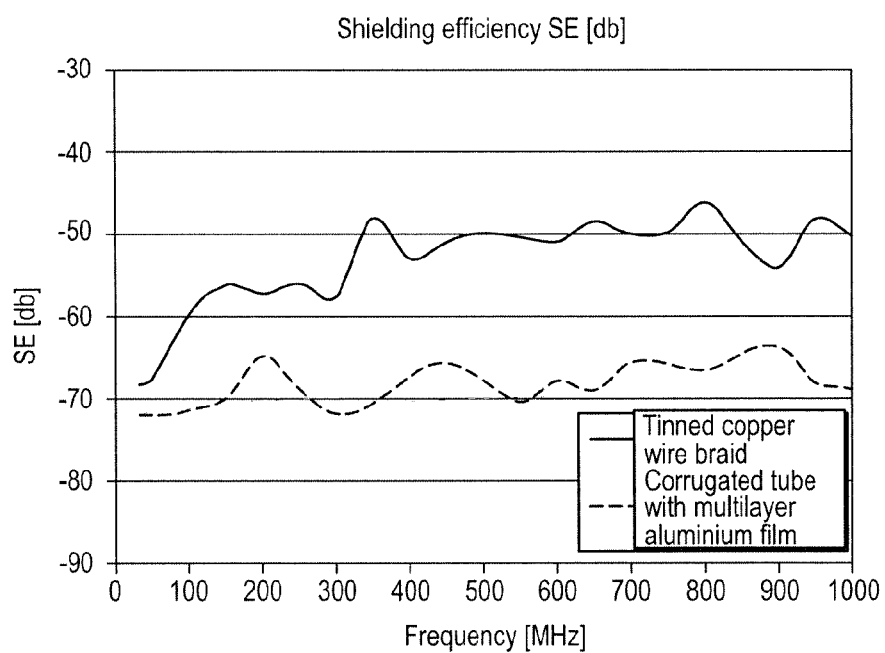
Fig. 6

FLEXIBLE, TOTAL COVERAGE ELECTROMAGNETIC WAVE SHIELDING SYSTEM

This application is a national stage application under 35 U.S.C. §371 of PCT Patent Application Serial No. PCT/EP2013/059685, filed May 9, 2013, which claims the priority benefit of Italy Patent Application No. MI2012A000788, filed May 9, 2012.

FIELD OF THE INVENTION

The present invention concerns a flexible, total coverage electromagnetic wave shielding system for conductor cables, as well as a production method of the said shielding system.

PRIOR ART

As is known, in various sectors of the industry it becomes necessary to protect one or more conductor cables from external agents, and at the same time mitigate disturbances of an electromagnetic nature both generated by the conductors and to which the conductors are subject when they are crossed by the electrical signal. Particularly in circuits, such as for example in the automotive or home automation circuit, wherein a plurality of conductor wires electrically connect two devices that are distant from each other, said conductor wires are inserted into sheaths or protective tubes, generally made of plastic or rubber material, in order to protect them from external mechanical actions, from aggressive dirt or from contact with parts that reach high temperatures and so forth.

In addition to this protective action of the mechanical type, the sheaths of more evolved type also play a the shielding action for electromagnetic waves, both those generated by the conductors with the transmission of the signal, both those that the conductor could be subject to from the surrounding environment due to the presence of electromagnetic waves of varying nature generated by other devices. We therefore speak in this case of true shielding systems, which absolve the dual function of mechanical protection of the conductors and shielding from electromagnetic waves.

It is into this type of shielding system that the solution object of the present invention is inserted.

A further requirement that the shielding systems for conductors of the type described must face is that of the possibility of flexing, achieving even very narrow curvature radii, meaning curvature radii approaching the values of the diameter of the shielding system, in order to allow the conductors to achieve tortuous "paths" made necessary by the overall system project, of the component, of the vehicle and so forth to which they are associated.

Among the shielding systems currently in use in the industry are known systems that employ thin metal films, such as, for example, thin aluminium or copper films, braids of conductive material, usually produced with fine strands of tinned copper, or mixed systems comprising films and braids.

The state of the art of these shielding systems will now be briefly illustrated so as to provide an understanding of the characteristics and drawbacks thereof.

As mentioned, a first shielding system of a known type consists of the placing of "thin metal films" onto a plastic sheath within which the conductors run. According to what is known in the prior art, a thin metal film forms an excellent shielding system in that it guarantees a 100% physical coverage of the surface of the sheath and, thus, a so-called total shielding coverage.

Thanks to the fact that the thin metal film applied produces a non-continuous coverage, propagation phenomena of the electromagnetic waves do not occur inside or outside the shield.

These shielding systems generally consist of one or more layers of metal material, preferably coupled with thin plastic films, generally made of polyester, in order to give the film greater mechanical strength.

As is known, the shielding systems with thin metal films are characterized by an extremely low flexibility, in that if the metal film is subjected to traction it tends to tear even due to extremely low deformation values, and therefore find no use in applications that require narrow curvature radii of the shield, in both static and dynamic applications.

These limits in the flexibility of the thin metal film shielding systems have been addressed by "bandaging" the cables with an aluminium film, with partial overlapping at each turn. It is nevertheless evident that this solution has only minimally contributed to improving the flexibility of the thin film shielding system, which remains substantially unsuitable for applications that require a high flexibility of the sheath onto which the film is applied.

Another shielding system of a known type and fairly widespread is the one wherein the plastic sheath is covered by a "metal braid".

The metal braids overcome the flexibility problems of the thin film shields in that the construction of the shield (consisting precisely of a braid made of metal material) guarantees good flexibility thanks to the capacity of the braid structure to elongate and expand adapting to the geometries imposed by the curvature of the cables.

Thus in this case, the obtainable shielding system is in fact flexible, however the shield is, by the very nature of the construction of the shielding braid itself, discontinuous, and it is therefore physically impossible to obtain a full, 100% coverage. The metal braid is indeed a discontinuous geometric solution with which it is possible to obtain, in the best case scenario, physical coverages of 95-97%, which do not therefore ensure an effective shielding from electromagnetic waves. In addition, when moving on to evaluate the problem of shielding system flexibility, there is the further drawback that the braid tends to widen for particularly narrow curvature radii, and the widening of the meshes also significantly reduces the coverage and thus the shielding action.

For this reason there are also known hybrid systems, wherein the metal braid is associated with one or more thin metal films, in this way attempting to combine the advantages of the two systems. Nevertheless, even in this case a breakage of the continuous metal file following a curvature of the sheath causes the loss of total coverage.

In addition, the economic aspects of the production of these types of shields, which are fairly expensive, are not secondary.

As mentioned, the need for a system flexible shielding system for conductors has arisen from the adaptability requirements of the system to the geometries of the circuits that require the conductors to perform curves with narrow curvature radius. Additionally, the shielded cables are used both in static applications, wherein a very limited number of bending cycles is imposed, for example during the installation of the system, and in dynamic applications, wherein the shield is subjected to a very high number of cycles, and the shielding system must therefore not only be deformable, but also resistant to a bending stress fatigue.

Of the technical solutions that have attempted to provide a shielding system characterized by both a good shielding efficacy and a certain flexibility, there can for example count extruded plastic profiles covered by an application of aluminium film: in these cases there is obtained a good shielding action guaranteed by the continuity of the coverage offered by the aluminium film, on the other hand, the extruded tube has, as is known, a very limited flexibility typical of the products obtained by extrusion; the corrugated plastic pipes, coated externally and/or internally, with an electrically conductive shielding layer obtained by means of electrolytic deposition. In this case, the bending limits of the extruded pipe are overcome by the corrugated shape of the tube, however, the flexibility is limited by the nature of the shielding coating. The electrolytic coating is indeed in itself fragile and integrally clamped to the tube, adhering thereto due to the very nature of the electrolytic deposition process, and therefore the bending of the corrugated support determines deformations of the metal coating that is forced to deform with the same deformation values of the corrugated tube onto which it was deposited. Since, as is known, the deformations at break of the metal coating are significantly inferior with respect to those of the corrugated tube, the coating rapidly breaks thereby de facto limiting the bending capacity of the system. Not least, the high costs connected to the electrolytic deposition process must be counted as a drawback afflicting this solution of a known type.

A conceptually similar solution to the one just illustrated is the solution consisting of shielding systems in which the shielding coating is obtained by graphitization of the surface of a corrugated tube. In this case the obtainable flexibility values are very good, on the other hand, the shielding efficacy of the coating is very poor on account of the poor electrical conductivity of the coating.

SUMMARY OF THE INVENTION

The main aim of the present invention is therefore to provide a total coverage shielding system for conductor cables that is characterized by a high flexibility, thus overcoming the drawbacks that afflict the known solutions which have until now attempted to combine these antithetical aspects.

Within this aim, the object of the present invention is to provide a shielding system that achieves the same flexibility values of the coating-free corrugated tubes while maintaining 100% coverage of the surface on the part of the shielding coat without the occurrence of breakages or discontinuity of the coating.

A further aim of the present invention is to provide a total coverage and flexible shielding system for conductor cables that is economical, characterized by low production costs.

Not least, the aim of the present invention is to provide a production method of a total coverage shielding system for conductor cables that is characterized by high flexibility.

This aim and these and other objects that will become clearer below are achieved by a shielding system for conductor cables as claimed in the accompanying claims, which are an integral part of the descriptive text.

These are in particular achieved by a shielding system of the type comprising a plastic sheath coated with one or more thin films of high electrical conductivity material, characterized in that said sheath consists of a corrugated tube and in that said coating with one or more thin films of high electrical conductivity material is applied onto said corrugated tube, by means of an adhesive substance adapted to produce a reversible adhesion condition between said coating and said corrugated tube or by mechanical shaping to the surface of the tube in the absence of adhesives thanks to the presence of a further outer polymer layer that keeps the coating film in position, so that said coating can be disengaged from the corrugated tube through high system bending values, as well as by a production method of said shielding system.

BRIEF DESCRIPTION OF THE DRAWINGS

Further characteristics and advantages of the present invention shall become clearer from the following detailed description, provided by way of a non-limiting example and illustrated in the accompanying drawings, wherein:

FIG. 5 schematically shows the bending behaviour of the shielding system according to the present invention;

FIGS. 5a and 5b show some details of FIG. 5;

FIG. 6 is a graph that shows the comparison between the shielding efficacy of a metal braid system of the type known in the prior art and that of the shielding system object of the present invention, given the same bending deformation.

DETAILED DESCRIPTION OF THE INVENTION

In shielding systems comprising a corrugated or coiled plastic tube, a thin metal film, that is sometimes in turn coupled with a thin plastic film, is coupled to the plastic tube, generally externally thereto, sometimes also internally or only internally.

Figure 1:
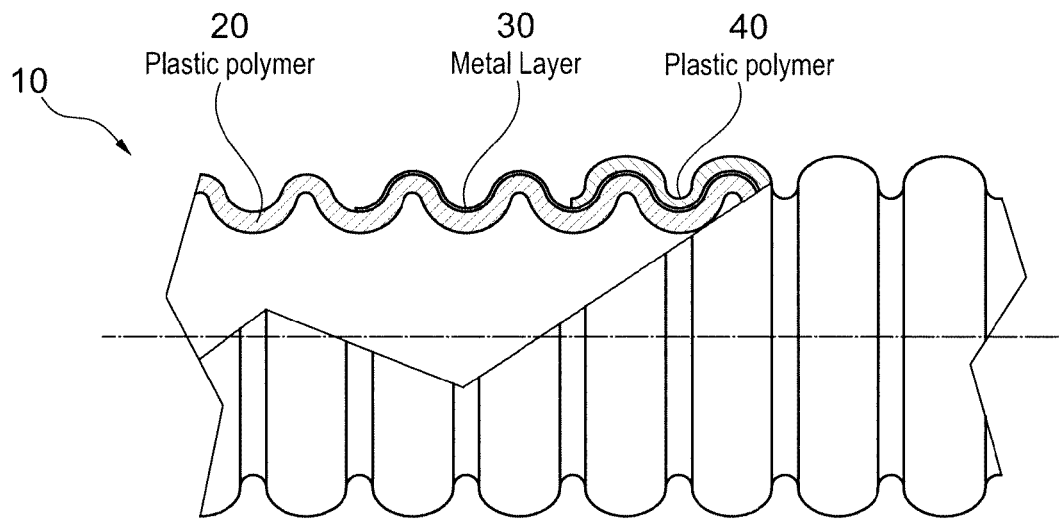
FIGS. 1 and 2 show two schematic images of two possible embodiments of a shielding system according to the present invention wherein a corrugated tube is respectively coated with one or more layers of metal material.
Figure 2:
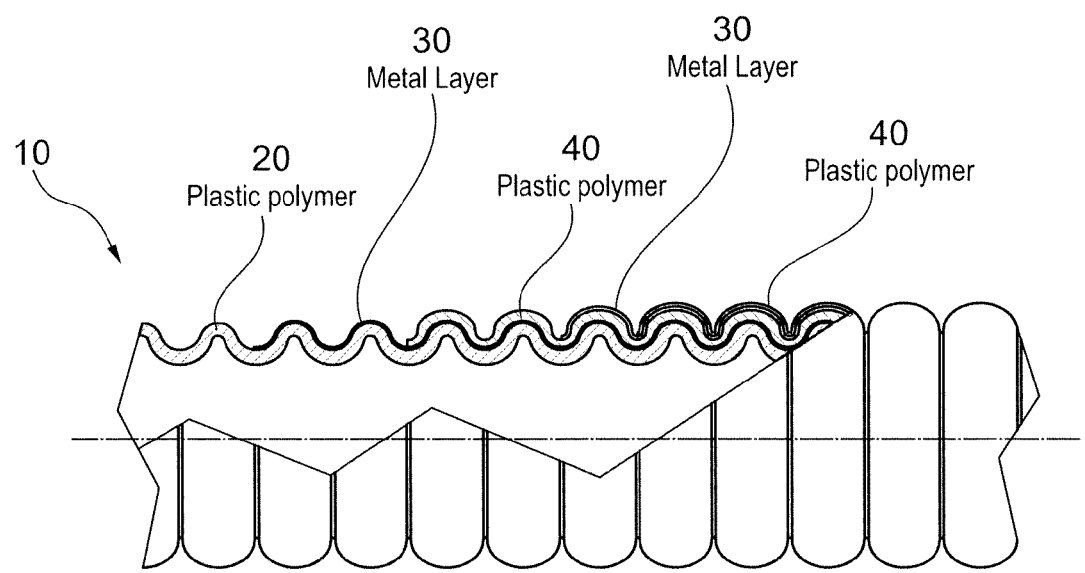

In greater detail, and with particular reference to FIGS. 1 and 2, the shielding system according to the present invention comprises a plastic sheath 20 within which will be inserted the conductor cables, when in use, coated with a coating produced from one or more thin films made of high electric conductivity material 30.

In particular, said plastic sheath consists of a corrugated tube 20 with structural characteristics and functions, having to protect the conductor cables that cross it, and the high electrical conductivity coating material consists of a thin metal film 30 made, for example, of copper or aluminium or similar high electrical conductivity materials. According to a preferred embodiment of the present invention, the shielding system also includes a further second thin layer of polymer material 40 externally applied to the metal film 30 and having the purpose of "encapsulating" the metal film thereby protecting it. A thin metal film 30 can in turn be a coupled aluminium-polyester film, namely a composite film wherein the metal layer is supported by a polyester base.

A thin metal film 30 can also be a multilayer film comprising a plurality of thin metal layers or of layers of coupled aluminium-polyester film.

FIG. 2 shows a second preferred embodiment of the shielding system according to the present invention, wherein there are present two metal coating layers in order to obtain a further increase in the electromagnetic wave shielding properties.

According to what is described herein, it is understood how alternative embodiments of the shielding system according to the present invention can include a different number of layers of a metal film, different materials such as aluminium, copper or other materials still for the production of the metal film, and different thicknesses of these layers of a metal film, which could also be equally applied to the inner surface the plastic sheath.

The thicknesses of the metal layers, for example aluminium layers, can vary from 6 μm to 60 μm, with typical values between 7 μm and 12 μm. The thickness of the polymer layer, in the case of coupled metal-polyester film, is typically 12 μm.

In the preferred embodiment of the shielding system according to the present invention illustrated in the accompanying figures by way of a non-limiting example, said metal film 30 adheres to the outer surface of the corrugated tube 20.

As mentioned, the shielding system according to the present invention combines the advantages in terms of flexibility of a corrugated plastic pipe and the advantages in terms of shielding effect of a continuous metal film system.

In order to achieve a high flexibility, the corrugated tubes exploit the mechanical principle linked to the geometry of the corrugated walls: bending of the tube is given by the summation of the multiple bends of the tube walls that form the ridges and valleys of the corrugation.

It is this very geometric factor that allows the portion of the tube inside the curve (the inner surface) to "flatten", reducing the distance between ridges and valleys, and the portion of the tube outside the curve (the outer surface) to "stretch", increasing the distance between ridges and valleys, thereby reducing strains on the tube wall to a minimum. This situation is illustrated in FIG. 5, where the flattening of the tube wall inside the curve and the stretching of the tube wall outside of the curve are noted.

It is clear that with respect to non-corrugated tubes, corrugated tubes are subjected to lesser stresses precisely thanks to the above-explained ridges and valleys behaviour that reduces deformations of the plastic tube.

When a thin metal film is applied to the corrugated tube the former is subjected to the same deformations as the tube itself in that it follows the profile thereof, and therefore when the metal film is coupled to a corrugated tube the metal film is subjected to lesser deformations than when it is applied to a smooth tube.

Nevertheless, a thin metal film continues, with the fragility thereof, to limit the bending possibility of the corrugated tube, and the causes of this technical problem will now be illustrated in detail.

Figure 3:
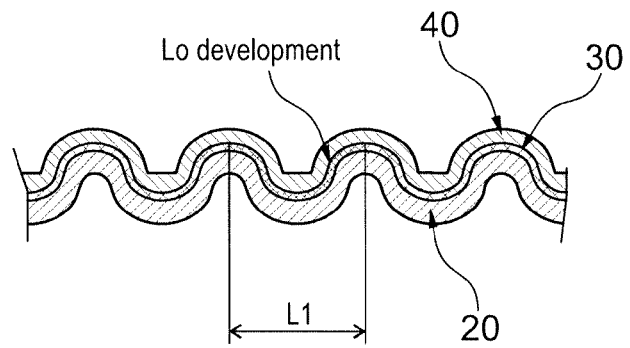
FIG. 3 shows a detail of a section of a shielding system according to the present invention.

FIG. 3 shows a section of the shielding system comprising a corrugated tube and a metal film in a non-deformed condition. When the distance between two consecutive ridges of the corrugated profile of the tube is $L_1$, the development, or length, of the section of metal film that follows ridges and valleys of the corrugated tube is $L_0$.

On the other hand, FIG. 5 shows what happens when the corrugated tube is bent. As previously mentioned, the part of the tube inside the curve tends to compress while the part of the tube outside the curve tends to stretch.

When the ridges and the valleys of the corrugated tube are "stretched" at the outer surface, the situation depicted in FIG. 5a occurs. The layer of metal film tends to rise from the plastic substrate attempting, insofar as possible, to maintain its original, non-deformed length $L_0$. The plastic tube instead undergoes a deformation such that the original distance between two consecutive ridges $L_1$ becomes equal to $L_1 + \Delta L$.

By suitably selecting the corrugation profile so that the length $L_0$ of the extension of the non-deformed metal film is greater than $L_1 + \Delta L$, it is possible to avoid the occurrence of the condition wherein the metal film is subjected to traction, with the consequent risk of fractures thereof.

The curvability limit of the tube without risk of breaking the metal film is thus achieved when the deformation $L_1 + \Delta L$ is equal to the development $L_0$ of the non-deformed metal film.

Figure 4:
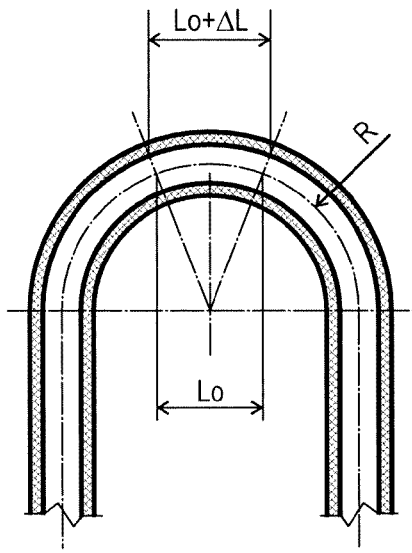
FIG. 4 schematically shows the deformation in elongation of the sections of a generic tube subjected to bending.
Figure 4:
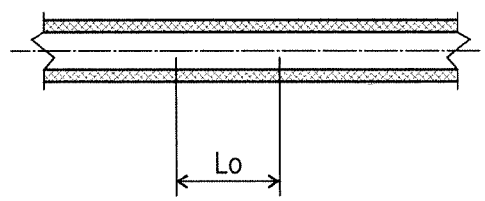

With reference to FIG. 4, a smooth tube with cylindrical geometry subjected to a curvature having radius R is shown.

Supposing that in the non-deformed straight condition, a section of tube has length $L_0$, when the tube is bent with a curvature radius R, the outer part or outer surface of tube (and thus the metal film adhering thereto) is subject to an imposed deformation that causes the elongation thereof from the original value $L_0$ to $L_0 + \Delta L$.

More precisely, the elongation $\epsilon = \Delta L / L_0$ to which the metal film subjected is equal to d/2R, where d is the diameter of the tube.

Thus, by way of example, in the case in which a plastic tube having a diameter d=10 mm is bent with a curvature radius R=25 mm, the deformation imposed on the film is 20%, with the consequence that a real shattering of the metal film is observed. Indeed, again by way of example, considering an aluminium film having an elongation at break breaking elongation at break of about 10%, existing deformations in the order of 20%, like the one just considered cause breakage of the film, with consequent impairment of the shielding effect.

The calculation example reported herein, illustrated with reference to a non-corrugated cylindrical tube, with maximum deformation tolerable by the film before reaching breakages clarifies that if the metal film is deformed with the same deformation value as the plastic tube, as occurs in the solutions of the type known in the prior art wherein the metal coating adheres to the substrate sheath, the deformed length of the metal film coincides with the deformed length of the sheath $L_1 + \Delta L$ and is equal to the value of the non-deformed development of the metal film $L_0$, resulting in the breakage thereof.

So as to prevent this situation from occurring and to ensure that said coating can be uncoupled from the corrugated tube by high bending values, the shielding system according to the present invention provides that there is no cohesion between the metal film 30 and the surface of the corrugated tube 20. This can be obtained through the use of thin metal films suitably coupled so as to allow an easy mechanical conformation to the surface of the tube, for example by using metal films coupled with paper. Preferably, it is useful to provide that the metal film 30 adheres by means of pressure-sensitive adhesives (PSA), the characteristic of which is to provide an adhesion between metal film 30 and corrugated tube 20 of reversible type.

Where other adhesives require heat or some type of solvent to efficiently bind two materials, pressure sensitive adhesives (PSA) simply require pressure. An intrinsic characteristic of pressure sensitive adhesives is that chemical bonds with the substrate are not formed and that it can be easily detached without damaging the surface.

In the case of the present invention, the "pressure sensitive" adhesive is deposited on the surface of the coating 30 intended to come into contact with the outer surface of the corrugated tube 20, or on the outer surface of the corrugated tube 20, and ensures the necessary adhesion of the metal film to the corrugated tube plastic, nevertheless it at the same time allows, when the corrugated tube is bent upon reaching the deformed condition $L_1 + \Delta L$ of FIG. 5a, the tension forces that tend to keep the section of metal film in a condition as close as possible to the non-deformed condition $L_0$ to be sufficient to determine the removal of the metal film itself from the corrugated support, according to what can again be seen in FIG. 5a.

For this reason the "pressure sensitive" adhesive is defined as able to implement a reversible adhesion between film and tube.

There not being a situation of perfect cohesion between metal film and corrugated support according to what was occurring, in the solutions known in the prior art, the shielding system according to the present invention guarantees the achievement of bending values of the tube comparable to those of an uncoated, corrugated plastic tube, combining this flexibility with an excellent electromagnetic wave shielding value, values that can only be achieved using a metal film system that ensures a total coverage of the shielding system.

With the shielding system according to the present invention that provides for the metal film to be applied to the corrugated tube by means of an adhesive substance adapted to achieve a reversible adhesion condition between film and tube, the metal film 30 thus avails of the possibility of rising slightly from the surface of the corrugated bearing tube 20, obtaining a separation of the deformations imposed by the bending on the metal film 30 with respect to those imposed on the corrugated tube 20, with the result of undoing the strains introduced into the metal film itself.

For the correct operation of the invention, it is therefore necessary for there to be no strong adhesion/bond between the metal film and the plastic tube, so as to allow decoupling of the tube-metal film deformations, and also, in the case in which on top of said metal film there is a further outer layer of polymer material 40, the latter be sufficiently deformable to allow the metal film 30 to be easily lifted.

Turning now to the production method of the shielding system according to the present invention, the corrugated tube can be produced by means of a process of extrusion and corrugation of thermoplastic materials, according to what is known in the prior art.

Once the tube has been produced, the application process of the metal film 30 or, according to one possible variant, the application of the multilayer metal-polyester material always indicated with the reference numeral 30 in the accompanying schematic drawings, provides for the interposition of an adhesive substance adapted to produce a reversible adhesion condition between said metal film and said corrugated tube, and the copying of the plastic substrate by the metal film.

Said adhesive substance, preferably an adhesive of the pressure sensitive type (PSA) can be deposited on the surface of said coating 30 intended to come into contact with the outer surface of said corrugated tube 20 or directly on the surface of said corrugated tube 20 intended to be coated with the metal film.

According to a preferred aspect of the process, the metal film consists of a band of material which is longitudinally wound on the outer surface of the corrugated tube with application such as to be able to copy the profile of the corrugated tube in an optimal manner.

According to a further preferred aspect of the process according to the present invention, in compliance with what is described in relation to the product, following application of the metal film, the process can provide for the tube to pass through a coating head capable of creating vacuum conditions for the application, above mentioned metal film 30, of a thin plastic film 40 characterized by high elasticity so as not to compromise the bending characteristics of the shielding system obtained. According to one possible variant, the thin plastic film that forms the outer encapsulating coating 40 can have insect/rodent repellent properties. This can be obtained by inserting in the plastic coating formulation specific repellent substances known in the prior art.

It has thus been shown that the shielding system and the production method of said shielding system allow the intended aim and objects to be achieved.

In particular, the shielding system with thin metal films according to the present invention is characterized in that it has a high degree of flexibility, equal to that of the unshielded corrugated tubes, without adversely affecting the continuity of the metal coating, i.e. guaranteeing maintenance of the total 100% coverage.

In order to make the technical result achieved by the present invention immediately understandable in terms of system shielding capacity, FIG. 6 shows a graph wherein the value, expressed in decibels [db] of the shielding efficacy (SE) is reported in the ordinate, and the value of electromagnetic waves frequencies, expressed in mega Hertz [MHz], in the abscissa.

The graph shows typical values of the shielding efficacy of shielding system according to the present invention in a configuration wherein the corrugated tube is coated with a multilayer aluminium film, compared with the shielding efficacy of a metal braid shielding system of the type known in the prior art, produced with tinned copper and suitable for guaranteeing a 96% coverage.

The tests were performed on a range of frequencies between 30 MHz and 1 GHz, and the metal braid was tested under ideal conditions, i.e. under an unbent system. It is thus even clearer how advantageous the solution object of the present invention is in terms of shielding efficacy, the gap between the two solutions only being able to grow in bent system conditions, wherein the bending reduces the coverage value of the metal braid on account of the widening of the meshes.

As can be seen, the shielding power of the tube with aluminium film is superior to that of the metal braids for each frequency value.

Numerous changes can be made by persons skilled in the art without deviating from the scope of protection of the present invention.

The scope of protection of the claims must not thus be restricted by the illustrations or by the preferred embodiments provided by way of example in the description but rather comprises all the characteristics of patentable novelty arising from the present invention, including all the characteristics that are deemed equivalent by a person skilled in the art.

The invention claimed is:

1. A shielding device for conductor cables comprising;
   a plastic sheath comprising a corrugated tube configured to receive one or more conductor cables;
   an outer coating mechanically shaped onto an outer surface of the corrugated tube, the outer coating comprising one or more thin films of a high electric conductivity material; and
   an adhesive between said plastic sheath and said outer coating, the adhesive configured to provide reversible adhesion between said outer coating and said corrugated tube, wherein said outer coating may be uncoupled from the corrugated tube when the shielding device is subjected to bending.

2. The shielding device as set forth in claim 1 further comprising a layer of high elasticity polymer material surrounding the one or more thin films metal films.

3. The shielding device as set forth in claim 1, wherein said adhesive is a pressure sensitive adhesive.

4. The shielding device as set forth in claim 1, wherein said outer coating comprises one or more thin metal films.

5. The shielding device as set forth in claim 4, wherein said one or more thin metal films comprise copper or aluminium.

6. The shielding device as set forth in claim 4, wherein said one or more thin metal films comprise multilayer films comprising a plurality of thin metal layers, aluminium-polyester layers, or aluminium-paper film layers.

7. A method for producing a shielding device for conductor cables comprising:
- extruding and corrugating a plastic material to form a plastic sheath in the form of a corrugated tube configured to receive one or more conductor cables;
- mechanically shaping an outer coating comprising one or more thin films of a high electric conductivity material on an outer surface of said corrugated tube: and
- providing an adhesive between said corrugated tube and said outer coating to provide reversible adhesion between said outer coating and said corrugated tube, wherein said outer coating may be uncoupled from the corrugated tube when the shielding device is subjected to bending.

8. The method as set forth in claim 7 further comprising:
- applying a layer of high elasticity polymer material on an outer surface of the outer coating to encapsulate the outer coating within a protective layer and to maintain the reversible adhesion between said outer coating and the corrugated tube.

9. The method as set forth in claim 7, wherein said adhesive is a pressure sensitive adhesive.

10. The method as set forth in claim 7, wherein providing the adhesive further comprises depositing the adhesive on an inner surface of said outer coating intended to come into contact with the outer surface of said corrugated tube.

11. The method as set forth in claim 7, wherein providing the adhesive further comprises depositing the adhesive on the outer surface of the corrugated tube.

\* \* \* \* \*